United States Patent [19]

Sakamoto et al.

[11] Patent Number: 4,931,755

[45] Date of Patent: Jun. 5, 1990

[54] SURFACE-ACOUSTIC-WAVE DEVICE WITH A CAPACITANCE COUPLED BETWEEN INPUT AND OUTPUT

[75] Inventors: Nobuyoshi Sakamoto; Ou H. Huor, both of Tokyo, Japan

[73] Assignee: Oki Electric Industry Co., Ltd., Tokyo, Japan

[21] Appl. No.: 275,406

[22] Filed: Nov. 21, 1988

[30] Foreign Application Priority Data

Nov. 20, 1987 [JP] Japan .................. 62-291972
Jun. 17, 1988 [JP] Japan .................. 63-79541

[51] Int. Cl.$^5$ .............................................. H03H 9/64
[52] U.S. Cl. .................. 333/193; 310/313 R; 310/313 B
[58] Field of Search ............... 333/193–196, 333/150–154; 30/313 R, 131 B, 313 C, 313 D

[56] References Cited

U.S. PATENT DOCUMENTS 3,582,840  6/1971  DeVries .................. 333/193
4,247,836  1/1981  Redwood et al. ............. 333/194 X
4,314,215  2/1982  Tanji et al. .................. 333/193
4,492,940  1/1985  Hikita .................. 333/194
4,649,357  3/1987  Nagai et al. .................. 333/194 X

FOREIGN PATENT DOCUMENTS 63917    4/1982  Japan .................. 333/195
158712   8/1985  Japan .................. 333/194
50109    3/1988  Japan .................. 333/193

OTHER PUBLICATIONS

Plass, K. G., "Acoustic Surface wave Band-Stop Filter For UHF Frequencies" *1973 European Microwave Conf.*, vol. II; Brussels, Belgium; 4–7 Sep. 1973.
"IEEE Transactions on Microwave Theory and Techniques"; vol. Mit-17, No. 11; Nov. 1969.
"Surface Acoustic Wave"; Denshi Tsushin Gakki; Nov. 15, 1983; p. 191.

*Primary Examiner*—Eugene R. LaRoche
*Assistant Examiner*—Benny Lee
*Attorney, Agent, or Firm*—Spencer & Frank

[57] ABSTRACT

A surface-acoustic-wave device includes a surface-acoustic-wave filter with a capacitance connected in parallel between its input and output leads. The capacitance improves the attenuation characteristic of the device on the high-frequency side of the center frequency.

4 Claims, 5 Drawing Sheets

SURFACE-ACOUSTIC-WAVE DEVICE WITH A CAPACITANCE COUPLED BETWEEN INPUT AND OUTPUT

BACKGROUND OF THE INVENTION

This invention relates to a surface-acoustic-wave device with an improved attenuation characteristic on the high-frequency side of the center frequency.

Devices which exploit the phenomenon of acoustic wave propagation along the surface of an elastic solid are widely used as filters, delay lines, resonators, oscillators, amplifiers, and convolvers in electronics and communications equipment. The basic component element of a surface-acoustic-wave device is an interdigital transducer comprising a pair of interdigital comb electrodes disposed on a piezoelectric substrate. When an electrical voltage is applied across the interdigital comb electrodes, they excite acoustic waves which propagate along the surface of the piezoelectric substrate in directions perpendicular to the interdigital comb electrodes. Alternatively, acoustic surface waves propagating in these directions can be received by the interdigital transducer, which converts them to an electrical voltage signal.

A simple surface-acoustic-wave device has two such interdigital transducers: an input interdigital transducer for converting an electrical input signal to a surface acoustic wave; and an output interdigital transducer for receiving the surface acoustic wave and converting it to an electrical signal. Such a surface-acoustic-wave device acts as a bandpass filter by attenuating frequency components above and below a center frequency.

A substantial insertion loss occurs in this simple surface-acoustic-wave filter design because the input interdigital transducer generates surface acoustic waves in two opposite directions, but only the acoustic surface wave propagated toward the output interdigital transducer is received. The insertion loss can be reduced by arranging a plurality of input interdigital transducers and a plurality of output interdigital transducers in alternating sequence in a row on the piezoelectric substrate, with input interdigital transducers at both ends of the row. In this configuration, the general formula for the inertion loss is 10 log(N/M) decibels, where N is the number of input interdigital transducers and M is the number of output interdigital transducers (M=N−1). A prior-art device with three input interdigital transducers and two output interdigital transducers, for example, has an insertion loss of only 10 log(3/2) or substantially 1.76 dB.

A problem in prior-art devices of this design is that while increasing the number of interdigital transducers reduces the insertion loss, it also reduces the amount of attenuation in the attenuation bands.

SUMMARY OF THE INVENTION

An object of this invention is to provide a surface-acoustic-wave device with an improved attenuation characteristic on the high-frequency side of the center frequency.

A surface-acoustic-wave device according to this invention comprises an input lead, an output lead, a surface-acoustic-wave filler connected between the input and output leads, and a capacitance connected between the input and output leads in parallel with the surface-acoustic-wave filter.

DETAILED DESCRIPTION OF THE EMBODIMENTS

Preferred embodiments of this invention will be described with reference to the drawings.

Figure 1:
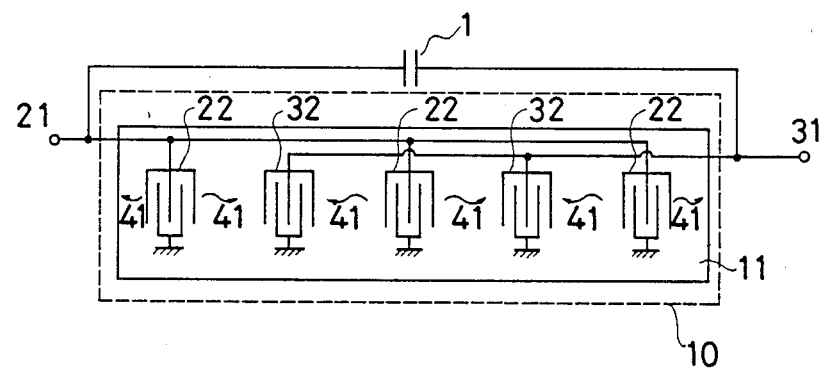
FIG. 1 is a plan view illustrating a first embodiment of the invention.

FIG. 1 is a plan view illustrating a first embodiment of the invention. The device in FIG. 1 comprises a surface-acoustic-wave filter chip 10, an input lead 21 and an output lead 31 connected to the surface-acoustic-wave filter chip 10, and a capacitor 1 connected between the input lead 21 and output lead 31 in parallel with the acoustic filter chip 10. If the device is intended for operation in the 800 MHz band, for example, the capacitance of the capacitor 1 should preferably be in the range from 0.2 pF to 2.0 pF. The acoustic-surface-wave filter chip 10 comprises a piezoelectric substrate 11, the surface of which has been etched to create three input interdigital transducers 22 and two output interdigital transducers 32. Each input interdigital transducer 22 comprises a pair of interdigital comb electrodes, one of which is connected to the input lead 21, the other being connected to ground. Each output interdigital transducer 32 comprises a pair of interdigital comb electrodes, one of which is connected to the output lead 31, the other being connected to ground. The input interdigital transducers 22 and the output interdigital transducers 32 are disposed alternately in a row on the surface of the piezoelectric substrate 11.

An electrical input signal applied to the input lead 21 is transferred to the output lead 31 via two parallel paths: one through the capacitor 1; the other through the surface-acoustic-wave filter chip 10. On the surface-acoustic-wave filter chip 10, the input interdigital transducers 22 convert the input electrical signal to surface acoustic waves 41 that propagate on the surface of the piezoelectric substrate 11 in both directions perpendicular to the interdigital comb electrodes. The inner four surface acoustic waves 41 propagate to the two output surface-acoustic-wave transducers 32, which convert them to an electrical output signal that is produced from the output lead 31. The outer two surface acoustic waves 41 propagate toward the edges of the piezoelectric substrate 11 and are not received by the output interdigital transducers 32, hence an insertion loss occurs.

Figure 2:
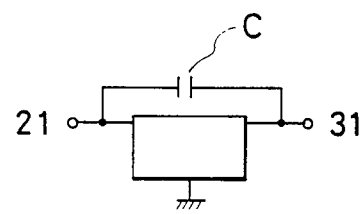
FIG. 2 is a schematic diagram of the invention.

FIG. 2 shows a schematic representation of the device in FIG. 1, and of the other embodiments of the invention to be described later. The device can be described as a surface-acoustic-wave filter having a parallel capacitance C connected across its input lead 21 and output lead 31. The effect of the capacitance C will be explained with reference to FIGS. 3, 4, and 5.

Figure 3:
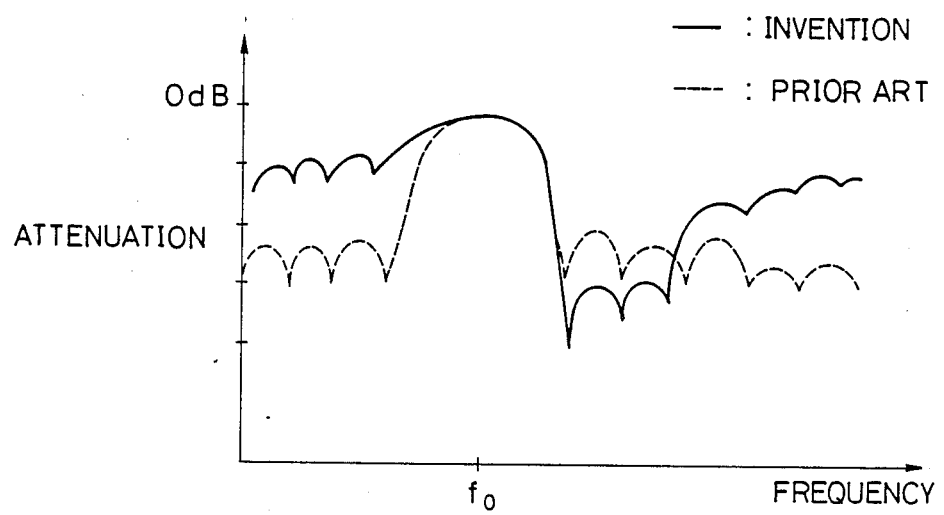
FIG. 3 is a graph illustrating attenuation vs. frequency characteristics of the invention and the prior art.

FIG. 3 shows the attenuation vs. frequency characteristics of the inventive device in FIGS. 1 and 2 and of a prior-art surface-acoustic-wave filter which is identical to the invention device except that it lacks the parallel capacitance C. The two characteristics are substantially the same in the immediate vicinity of the center frequency $f_0$ (the passband), but the characteristic of the inventive device provides a greater attenuation in the stop-band adjacent to the center frequency on the high-frequency side. It also provides less attenuation on the low-frequency side and at the far end of the high-frequency side. The reason for this is as follows.

A surface-acoustic-wave filter with multiple interdigital transducers (e.g. five interdigital transducers in this embodiment) can be regarded as a type of interdigital transducer resonator. FIG. 5 shows curves representing the input admittance vs. frequency characteristic of an interdigital transducer resonator. Such curves are also shown for example on page 191 of *Dansei Hyomenha Kogaku* (Surface Acoustic Wave Engineering) by Mikio Shibayama, published on Nov. 15, 1983 by the Institute of Electronics and Communication Engineers of Japan. The admittance Y is defined as the complex sum $Y = Ga + jB$, where Ga is the radiation conductance of the interdigital transducer resonator and B is its susceptance. For the prior-art device with no parallel capacitance, the susceptance is $B_1 = \omega C_T + Ba$, where $\omega$ is the angular frequency, $C_T$ is the damping capacitance of the interdigital transducer resonator, and Ba is its radiation susceptance. For the inventive device with the added parallel capacitance C, the susceptance is $B_2 = \omega(C_T + C) + Ba$. Separate curves are shown for Ga, $B_1$, and $B_2$ in FIG. 4. The effect of the parallel capacitance C is to lift the susceptance curve from $B_1$ to $B_2$ without changing the conductance curve Ga. As a result, the antiresonant frequency is shifted from $f_{a1}$ to $f_{a2}$, which is closer to the center frequency $f_0$, without changing the insertion loss at $f_0$.

Figure 4:
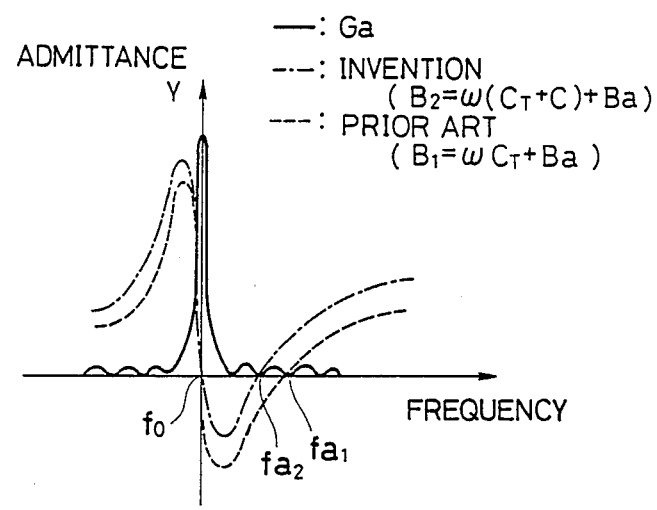
FIG. 4 is a graph illustrating admittance vs. frequency characteristics of the invention and the prior art.
Figure 5:
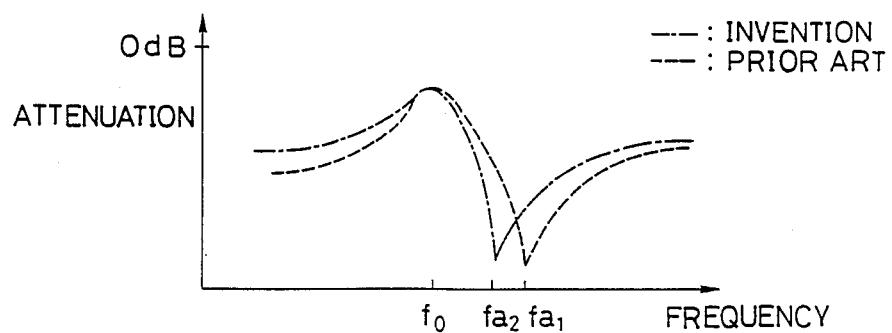
FIG. 5 is a graph illustrating attenuation vs. frequency characteristics derived from FIG. 4.

To show the effect of the parallel capacitance C more clearly, the admittance characteristics in FIG. 4 have been redrawn as attenuation characteristics in FIG. 5, in which the dashed line shows the prior-art characteristics and the dash-dot line shows the characteristic resulting from the addition of the parallel capacitance C. It is apparent that shifting the antiresonant frequency closer to the center frequency $f_0$ provides greater attenuation on the high-frequency side without affecting the insertion loss at the center frequency, which remains substantially 1.76 dB in this embodiment.

Another advantage provided by this embodiment is that since the electrical energy is distributed between the surface-acoustic-wave filter and the capacitance C, the inventive device can withstand higher power levels than a comparable prior-art device.

Figure 6:
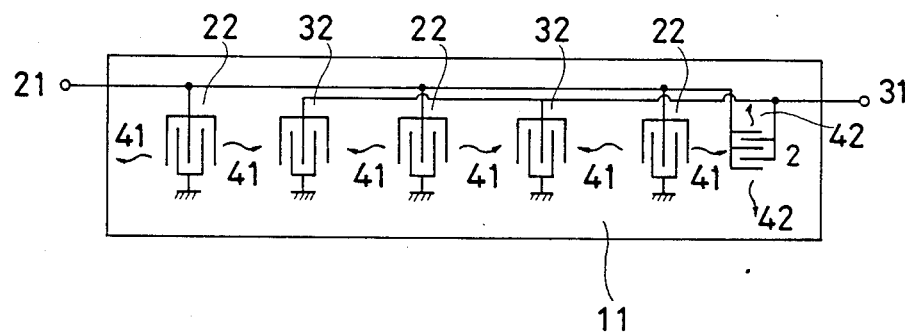
FIG. 6 is a plan view illustrating a second embodiment of the invention.

FIG. 6 is a plan view showing a second embodiment of this invention. Reference numerals in FIG. 6 which are identical to those in FIG. 1 indicate identical component elements. The novel component element is an interdigital transducer 2 disposed on the piezoelectric substrate 11, having one comb electrode connected to the input lead 21 and the other comb electrode connected to the output lead 31.

The interdigital transducer 2 in FIG. 6 provides a capacitance between the input and output leads 21 and 31 equivalent to that of the capacitor 1 in FIG. 1, thus functioning as the parallel capacitance C in FIG. 2. Accordingly, this embodiment operates in substantially the same way as the first embodiment and provides the same advantages, with the additional advantage that the entire device is integrated on a single chip.

A device built according to the second embodiment of the invention should preferably be structured to minimize the effect of the surface acoustic waves 42 excited by the interdigital transducer 2 on the attenuation vs. frequency characteristic. In particular, the interdigital transducer 2 should be oriented at right angles to the input and output interdigital transducers 22 and 32 as shown in FIG. 6; this by itself reduces the effect of the surface acoustic waves 42 to a substantially negligible level. The effect can be further reduced by designing the interdigital transducer 2 so that the surface acoustic waves 41 and 42 have different wavelengths. The wavelength of the surface acoustic waves depends on the pitch of the comb electrodes of the interdigital transducers. So using the interdigital transducer 2 with comb electrodes having a different pitch from the pitch of the comb electrodes of the interdigital transducers 22 and 32, the surface waves 41 and 42 will have different wavelengths.

Figure 7:
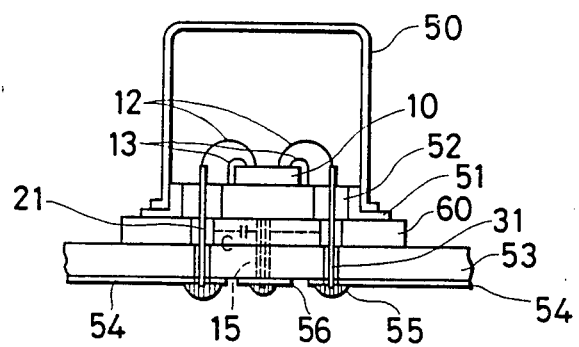
FIG. 7 is a side view illustrating a third embodiment of the invention.

FIG. 7 shows a side view of a third embodiment of the present invention. This embodiment comprises a surface-acoustic-wave filter chip 10 similar to that in FIG. 1 mounted on a base and enclosed in a can package. More specifically, the surface-acoustic-wave filter chip 10 is enclosed by a cover 50 which fits over a stem 51 to which the surface-acoustic-wave filter chip 10 is directly attached. The stem 51 in turn is mounted on a base 53, but a dielectric material 60 is interposed between the stem 51 and the base 53. The input lead 21 and output lead 31 are coupled to the surface-acoustic-wave filter chip 10 by bonding wires 12. Additional bonding wires 13 connect ground points on the surface-acoustic-wave filter chip 10 to the stem 51. The input lead 21 and output lead 31 pass through holes in the stem 51, the dielectric material 60, and the base 53 and are coupled to a patterned input/output conductor 54 on the underside of the base 53 by solder joints 55. After insertion into the holes, the input and output leads 21 and 31 are secured by glass 52, which is introduced into the holes in a molten state, then allowed to harden. Besides providing mechanical support for the input and output leads 21 and 31, the glass 52 electrically isolates them from the stem 51 and the base 53. An additional hole is provided through the dielectric material 60 and the base 53 for a ground lead 15, which couples the stem 51 to a ground conductor 56. The ground lead 15 is also secured by glass 52, and is attached to the ground conductor 56 by solder.

Due to the presence of the dielectric material 60, the capacitance C between the input lead 21 and the output lead 31 as indicated at C in FIG. 7 is increased. This capacitance C functions as the capacitance C in the schematic diagram in FIG. 2, and provides the same improved attenuation characteristic and other advantages as already described with reference to FIGS. 3, 4, and 5. The value of the capacitance C can be adjusted by varying the thickness of the dielectric material 60. The thicker the dielectric material 60, the greater the capacitance. It is also possible to adjust the value of the capacitance C by selection of the dielectric material 60 with an optimum dielectric constant.

It should be noted that the ground bonding leads 13 in the can package substantially prevent any capacitance from arising between the input/output leads 21 and 31 inside the can package.

Figure 8:
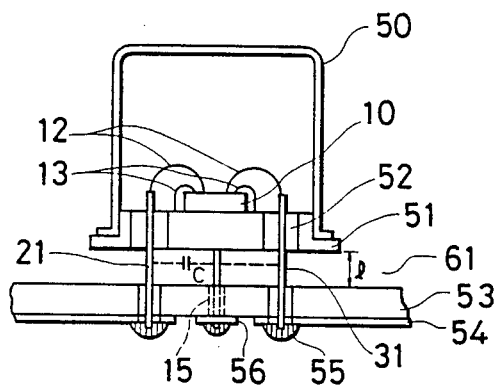
FIG. 8 is a side view illustrating a fourth embodiment of the invention.

FIG. 8 is a side view showing a fourth embodiment of the invention. This embodiment is identical to the third embodiment except that instead of a dielectric material, an air gap 61 is interposed between the stem 51 and the base 53. The stem 51 is accordingly phsysically supported by the input, output, and ground leads 21, 31, and 15, and possibly by additional supporting members not shown in the drawing.

Since air is itself a dielectric substance, the air gap 61 in FIG. 8 has an effect equivalent to that of the dielectric material 60 in FIG. 7, creating a capacitance C between the input lead 21 and the output lead 31, thus improving the attenuation characteristic of the device. The value of C is a design parameter that can be selected by choosing a suitable width l for the air gap.

The scope of this invention is not limited to the embodiments shown in the drawings but encompasses many variations and modifications which will be obvious to one skilled in the art. For example, the input and output roles of the elements in FIGS. 1 and 6 can be reversed, and the number of input/output interdigital transducers is not restricted to the five shown in those drawings.

What is claimed is:

1. A surface-acoustic-wave device, comprising:
an input lead;
an output lead;
a surface-acoustic-wave filter connected between said input lead and said output lead, said surface-acoustic-wave filter comprising a piezoelectric substrate;
a plurality of first interdigital transducers disposed in a row on the surface of said piezoelectric substrate, adjacent ones of said first interdigital transducers connected alternately to said input lead and said output lead;
capacitance means connected between said input lead and said output lead in parallel with said surface-acoustic-wave filter; said capacitance means comprising a further interdigital transducer disposed on said piezoelectric susbtrate; and wherein said first interdigital transducers and said further interdigital transducer each generate surface acoustic waves which are of different wavelengths from each other.

2. A surface-acoustic-wave device, comprising:
an input lead;
an output lead;
a surface-acoustic-wave filter connected between said input lead and said output lead; and
capacitance means connected between said input lead and said output lead in parallel with said surface-acoustic-wave filter; and
a base connected to said surface-acoustic-wave filter; and
a dielectric material which is interposed between said base and said surface-acoustic-wave filter, said input lead and said ouptut lead separately extending through said base and said dielectric material, whereby said dielectric material, said input lead, and said output lead together define said capacitance means.

3. A surface-acoustic-wave device, comprising:
an input lead;
an output lead;
a surface-acoustic-wave filter connected between said input lead and said output lead;
a capacitance means connected between said input lead and said output lead in parallel with said surface-acoustic-wave filter;
a base connected to said surface-acoustic-wave filter; and
an air gap interposed between said acoustic-wave-filter and said base, said input lead and said output lead extending separately through said base and said air gap; whereby said air gap, said input lead, and said output lead together define said capacitance means.

4. A surface-acoustic-wave device, comprising:
an input lead;
an output lead;
a surface-acoustic-wave filter connected between said input lead and said output lead, said surface-acoustic-wave filter comprising a piezoelectric substrate;
a plurality of first interdigital transducers disposed in a row on the surface of said piezeoelectric substrate, adjacent ones of said first interdigital transducers connected alternately to said input lead and said output lead;
capacitance means connected between said input lead and said output lead in parallel with said surface-acoustic-wave filter; said capacitance means comprising a further interdigital transducer disposed on said piezoelectric substrate having a first comb electrode connected to said input lead and a second electrode connected to said output lead; and wherein said first interdigital transducers and said further interdigital transducer each generate surface acoustic waves which are of different wavelengths from each other.

* * * * *